US012672339B2

(12) United States Patent
Hino et al.

(10) Patent No.:  US 12,672,339 B2
(45) Date of Patent:  Jun. 30, 2026

(54) SILICON CARBIDE SEMICONDUCTOR DEVICE AND POWER CONVERSION DEVICE USING SILICON CARBIDE SEMICONDUCTOR DEVICE

(71) Applicant: Mitsubishi Electric Corporation, Tokyo (JP)

(72) Inventors: Shiro Hino, Tokyo (JP); Kotaro Kawahara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 434 days.

(21) Appl. No.: 18/567,023

(22) PCT Filed: Jun. 14, 2021

(86) PCT No.: PCT/JP2021/022527
§ 371 (c)(1),
(2) Date: Dec. 5, 2023

(87) PCT Pub. No.: WO2022/264212
PCT Pub. Date: Dec. 22, 2022

(65) Prior Publication Data
US 2024/0274709 A1   Aug. 15, 2024

(51) Int. Cl.
*H10D 84/00*      (2025.01)
*H10D 62/10*      (2025.01)
(Continued)

(52) U.S. Cl.
CPC ......... *H10D 84/146* (2025.01); *H10D 62/126* (2025.01); *H10D 62/8325* (2025.01); *H10D 64/62* (2025.01)

(58) Field of Classification Search
CPC .. H10D 84/146; H10D 62/126; H10D 62/127; H10D 64/62; H10D 62/8325
See application file for complete search history.

(56) References Cited

U.S. PATENT DOCUMENTS 10,128,370 B2 * 11/2018 Ebihara ................ H10D 84/146
2009/0173949 A1    7/2009 Yatsuo et al.
(Continued)

FOREIGN PATENT DOCUMENTS

JP      2007-234925 A    9/2007
JP      2018-107168 A    7/2018
(Continued)

OTHER PUBLICATIONS

International Search Report and Written Opinion mailed on Aug. 24, 2021, received for PCT Application PCT/JP2021/022527, filed on Jun. 14, 2021, 9 pages including English Translation.

*Primary Examiner* — Caleen O Sullivan
*Assistant Examiner* — Brett Squires
(74) *Attorney, Agent, or Firm* — XSENSUS LLP

(57)      ABSTRACT

A silicon carbide semiconductor device according to the present disclosure includes: an n-type drift layer on an n-type semiconductor substrate; p-type well regions in a surface layer of the drift layer; an n-type first separation region between the well regions; an n-type second separation region; an n-type source region in each of the well regions; a p-type contact region; an n-type current diffusion region in a surface layer of each of the well regions; a gate insulating film; a gate electrode; an ohmic electrode; a Schottky electrode on the first separation region.

9 Claims, 6 Drawing Sheets

(51) Int. Cl.
_H10D 62/832_        (2025.01)
_H10D 64/62_         (2025.01)

(56)                    References Cited

U.S. PATENT DOCUMENTS

2018/0182885 A1      6/2018  Kobayashi
2020/0161480 A1      5/2020  Okamoto et al.
2022/0085169 A1 *    3/2022  Shimizu ................... H10D 8/60

FOREIGN PATENT DOCUMENTS

JP        2020-087958 A      6/2020
WO      WO-2019124384 A1 *    6/2019    ......... H10D 30/0291

* cited by examiner

F I G. 1
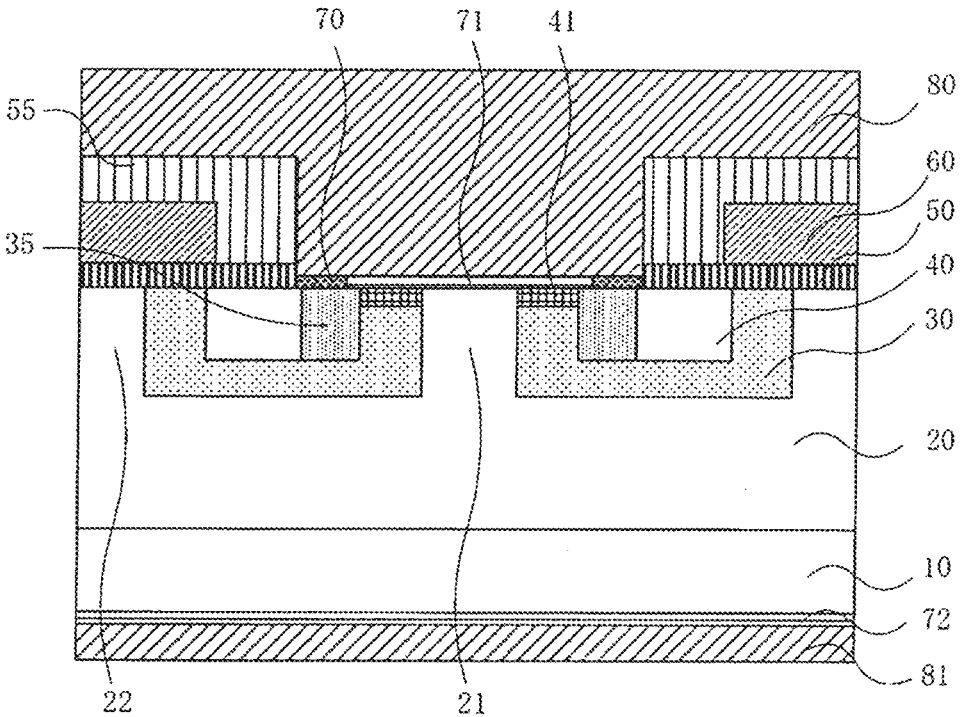

F I G.  3
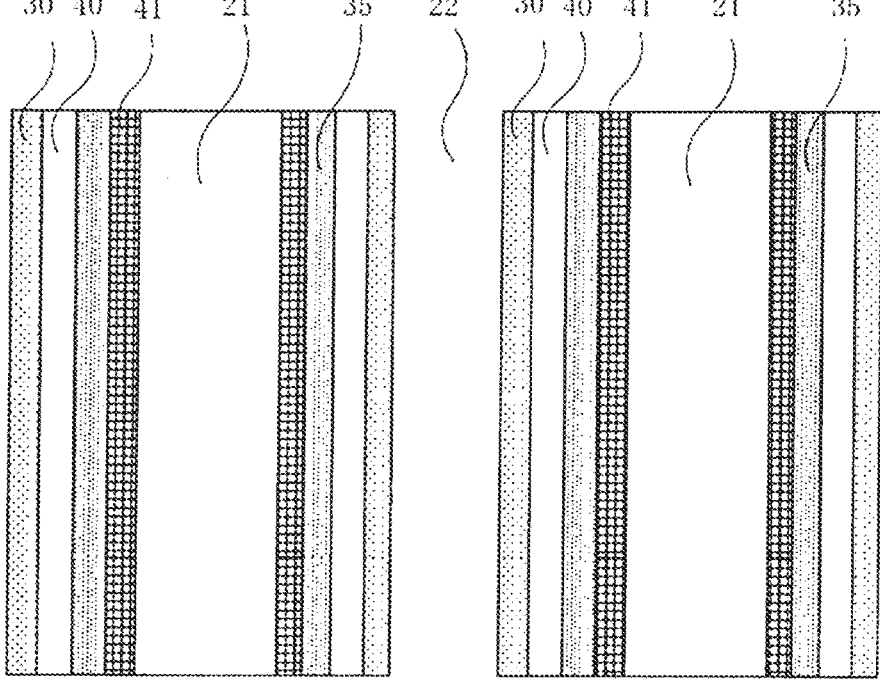

F I G. 4
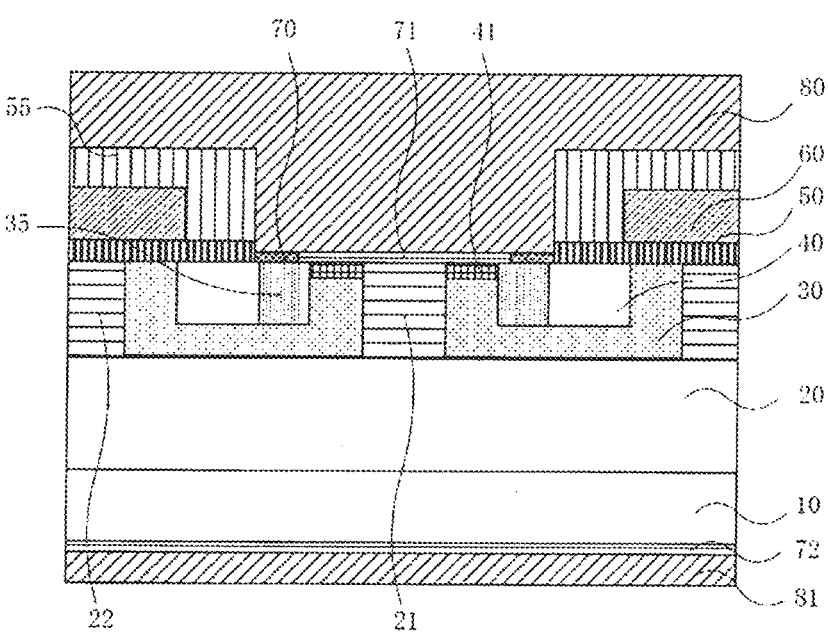

F I G. 5
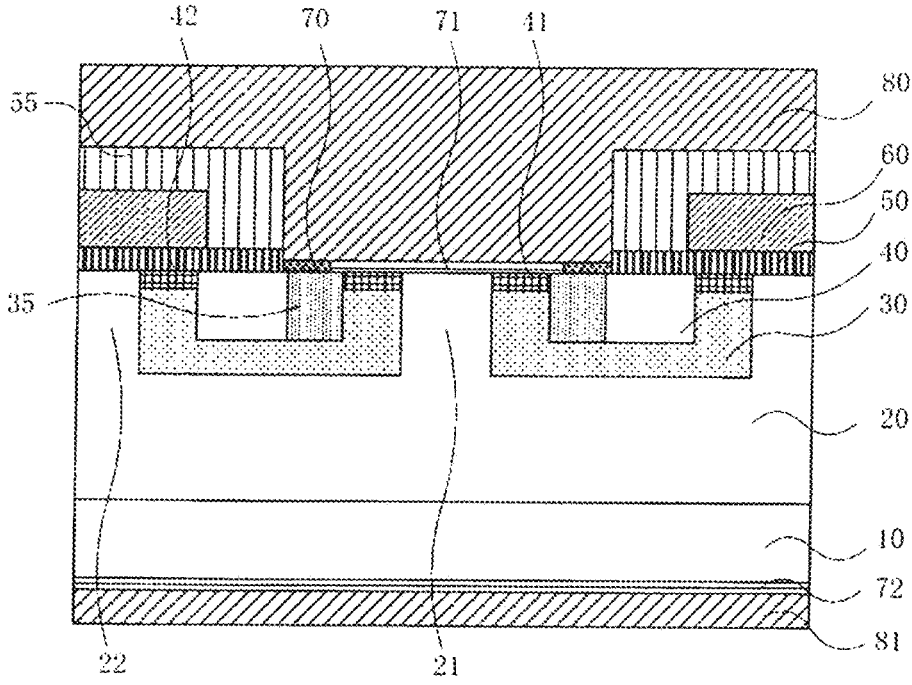

F I G.  6
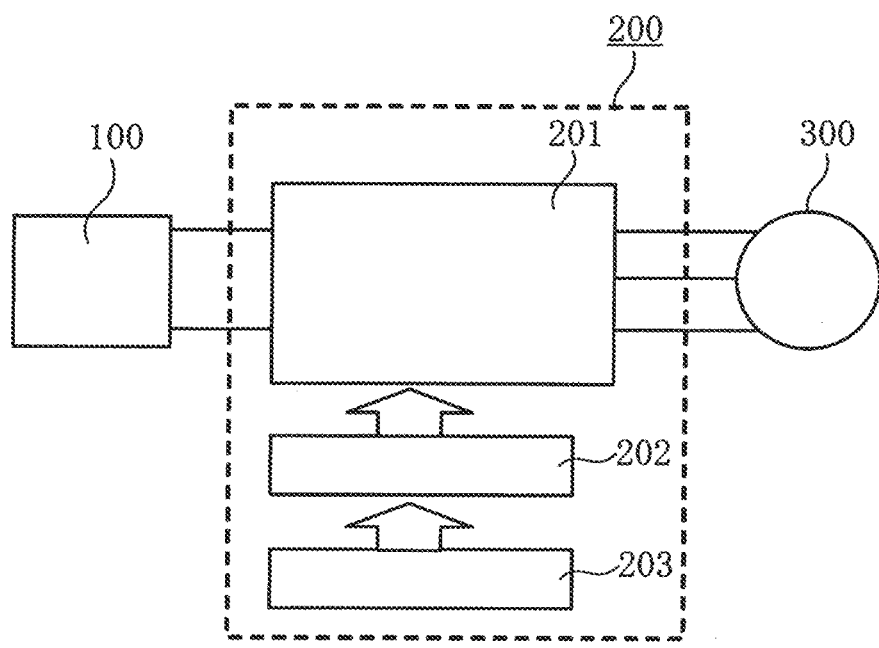

SILICON CARBIDE SEMICONDUCTOR DEVICE AND POWER CONVERSION DEVICE USING SILICON CARBIDE SEMICONDUCTOR DEVICE

CROSS-REFERENCE TO RELATED APPLICATION

This application is based on PCT filing PCT/JP2021/022527, filed Jun. 14, 2021, the entire contents of which are incorporated herein by reference.

TECHNICAL FIELD

The present disclosure relates to a silicon carbide semiconductor device and a power conversion device using the silicon carbide semiconductor device.

BACKGROUND ART

Known is a power semiconductor device including a built-in unipolar switching element such as a metal oxide semiconductor field effect transistor (MOSFET: insulated gate field effect transistor) and a built-in unipolar reflux diode such as a Schottky barrier diode (SBD) (for example, Patent Document 1). Such a semiconductor device can be achieved by parallelly locating a MOSFET cell and an SBD cell in one chip, and can be generally achieved by providing a Schottky electrode to a specific region in a chip and operating the region as an SBD.

The chip of the switching element includes a built-in reflux diode, thus cost can be reduced compared with a case where the reflux diode is externally provided to the switching element. Particularly, the MOSFET using silicon carbide (SiC) as a base material includes a built-in SBD, thus can also suppress a bipolar operation by a parasitic pn diode.

PRIOR ART DOCUMENTS

Patent Document(s)

Patent Document 1: Japanese Patent Application Laid-Open No. 2007-234925

SUMMARY

Problem to be Solved by the Invention

Such a MOSFET with the built-in SBD includes a Schottky diode made up of a Schottky electrode and a semiconductor layer of a certain conductivity type (for example, an n type). The semiconductor layer of the certain conductivity type (for example, the n type) is formed by being sandwiched by well regions of a conductivity type (for example, a p type) opposite to that of the semiconductor layer, and electrical field on a Schottky interface increases with increasing distance from the well regions of the opposite conductivity type (for example, the p type) on both sides.

In the meanwhile, there is a case where a current path of current flowing in the Schottky diode is spatially limited by the well regions of the opposite conductivity type (for example, the p type) on the both sides, thus a maximum value of the current flowing in the Schottky diode cannot be sufficiently increased.

The present disclosure is to solve the above problems, and an object is to provide a silicon carbide semiconductor device having high reliability by increasing current flowing a Schottky diode without increasing electrical field applied to a Schottky interface.

Means to Solve the Problem

A silicon carbide semiconductor device according to the present disclosure includes: a drift layer of a first conductivity type of a silicon carbide semiconductor formed on a first main surface of a semiconductor substrate of a first conductivity type; well regions of a second conductivity type formed separately in a cross-sectional lateral direction in a surface layer of the drift layer and including a first separation region of a first conductivity type therebetween; a second separation region of a first conductivity type formed in a region where the first separation region is not formed between the well regions; a source region of a first conductivity type formed in an inner part of a surface layer of a semiconductor in a cross-sectional lateral direction in each of the well regions; a contact region of a second conductivity type formed on a side closer to the first separation region in relation to the source region in the inner part of the surface layer of the semiconductor in the cross-sectional lateral direction in each of the well regions; a current diffusion region of a first conductivity type formed in a surface layer part of each of the well regions between the contact region and the first separation region; a gate insulating film formed on the second separation region and each of the well regions adjacent to the second separation region; a gate electrode formed on the gate insulating film; an ohmic electrode formed on the contact region; a Schottky electrode formed on the first separation region to be Schottky-connected to the first separation region; a source electrode formed on the ohmic electrode and the Schottky electrode; and a drain electrode formed on a second main surface of the semiconductor substrate located on a side opposite to the first main surface.

Effects of the Invention

According to the silicon carbide semiconductor device in the present disclosure, a silicon carbide semiconductor device having high reliability can be achieved.

BRIEF DESCRIPTION OF DRAWINGS

FIG. 1 A cross-sectional view of a silicon carbide semiconductor device according to an embodiment 1.

FIG. 3 A plan view of the silicon carbide semiconductor device according to the embodiment 1.

FIG. 4 A cross-sectional view of a modification example of the silicon carbide semiconductor device according to the embodiment 1.

FIG. 5 A cross-sectional view of a silicon carbide semiconductor device according to an embodiment 2.

FIG. 6 A schematic view illustrating a configuration of a power conversion device according to an embodiment 3.

DESCRIPTION OF EMBODIMENT(S)

Figure 2:
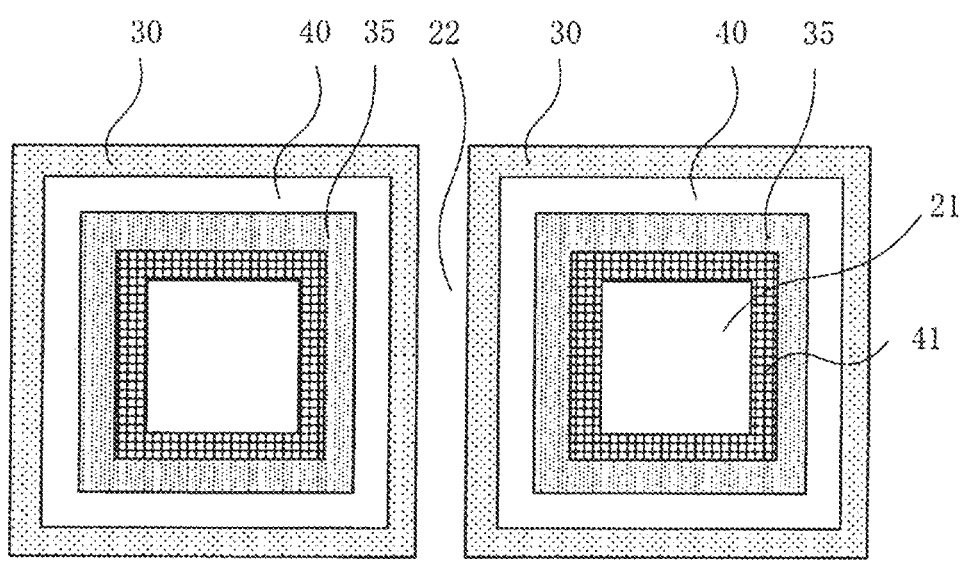
FIG. 2 A plan view of the silicon carbide semiconductor device according to the embodiment 1.

Embodiments are described hereinafter with reference to the appended drawings. The drawings are schematically illustrated, thus a size of an image and a mutual relationship of positions thereof each illustrated in the different drawings are not necessarily illustrated accurately, but can be appropriately changed. In the description hereinafter, the same reference numerals are assigned to the similar constituent elements in the illustration, and the same applies to names and functions thereof. Thus, a detailed description thereof may be omitted in some cases.

In the embodiments hereinafter, a first conductivity type is an n type and a second conductivity type is a p type, however, the conductivity type may be opposite.

Embodiment 1

Firstly described is a silicon carbide semiconductor device according to an embodiment 1 of the present disclosure.

FIG. 1 is a cross-sectional view of a part of an active region of a silicon carbide MOSFET with a built-in Schottky barrier diode (SiC-MOSFET with built-in SBD) as the silicon carbide semiconductor device according to the embodiment 1. FIG. 2 is a plan view of a part of the active region of the SiC trench MOSFET with the built-in SBD illustrated in FIG. 1.

As illustrated in FIG. 1, a drift layer 20 made up of n-type silicon carbide is formed on a surface of a semiconductor substrate 10 made up of n-type silicon carbide having low resistance. A pair of well regions 30 made up of p-type silicon carbide separated from each other in a cross-sectional view are provided to an upper layer part of the drift layer 20. A first separation region 21 as a part of the drift layer 20 is formed between the pair of well regions 30.

A second separation region 22 as a part of the drift layer 20 is formed on an outer side of the well region 30 with the first separation region 21 therebetween. A source region 40 made up of n-type silicon carbide is formed in a position in an inner part of the well region 30 in a cross-sectional lateral direction by a predetermined distance from an edge of the well region 30 on a side of the second separation region 22 to extend from the side of the second separation region 22 toward the first separation region 21. A contact region 35 made up of p-type silicon carbide having low resistance is formed on a further inner side of the source region 40, that is to say, in an inner part of a surface layer part of the well region 30 in a cross-sectional lateral direction on a side closer to the first separation region 21 in relation to the source region 40. Herein, a region made up of silicon carbide, that is to say, a region formed as the drift layer 20 is referred to as a silicon carbide layer regardless of presence or absence of ion implantation.

Herein, the source electrode 40 and the contact region 35 are formed to have contact with each other.

An n-type current diffusion region 41 having a higher n-type impurity concentration than the first separation region 21 is formed in the surface layer part of the well region 30 between the first separation region 21 and the contact region 35.

The ohmic electrode 70 is formed on surfaces of the source region 40 and the contact region 35. A Schottky electrode 71 is formed on the first separation region 21 and the current diffusion region 41, and the Schottky electrode 71 and the first separation region 21 are Schottky-connected to each other. The first separation region 21 and the Schottky electrode 71 constitute the SBD, and an interface between the first separation region 21 and the Schottky electrode 71 serves as a Schottky interface.

A gate insulating film 50 made up of silicon oxide is formed on a surface of the source region 40 in the well region 30, the second separation region 22, and the well region 30 between the source region 40 and the second separation region 22. A gate electrode 60 made up of low-resistive polycrystal silicon is formed on the gate insulating film 50 in a region ranging from the source region 40 and the second separation region 22. The surface layer part of the well region 30 facing the gate electrode 60 with the gate insulating film 50 therebetween in a lower part of a position where the gate electrode 60 is formed serves as a channel region.

An interlayer insulating film 55 made up of silicon oxide is formed on the gate electrode 60 and the gate insulating film 50. A contact hole in which the gate insulating film 50 and the interlayer insulating film 55 are removed is formed on the Schottky electrode 71 and the ohmic electrode 70, and a source electrode 80 is formed in the contact hole on the Schottky electrode 71 and the ohmic electrode 70 and on the interlayer insulating film 55.

A back surface ohmic electrode 72 and a drain electrode 81 located on an outer side of the back surface ohmic electrode 72 are formed on a surface of the semiconductor substrate 10 on a side opposite to the drift layer 20.

FIG. 2 is a plan view near a surface of a silicon carbide layer of the active region of the SiC-MOSFET with the built-in SBD according to the embodiment 1 in the present disclosure. In FIG. 2, the current diffusion region 41, the contact region 35, the source region 40, the well region 30, and the second separation region 22 are formed in this order from an inner side to surround the first separation region 21. The Schottky electrode 71 is formed on a region ranging from the first separation region 21 to the current diffusion region 41 also in a plan view. The ohmic electrode 70 is formed on the contact region 35. The gate electrode 60 is formed on an outer side of the ohmic electrode 70. The well region 30 is formed on a cross-sectional lower side of the current diffusion region 41.

A unit cell of the active region of the SiC-MOSFET with the built-in SBD according to the embodiment 1 in the present disclosure may have a stripe shape in a plan view illustrated in FIG. 3. Even in the unit cell having the stripe shape, the current diffusion region 41, the contact region 35, the source region 40, the well region 30, and the second separation region 22 are formed in this order from an inner side to center on the first separation region 21.

Herein described is a method of manufacturing the SiC-MOSFET with the built-in SBD as the silicon carbide semiconductor device according to the embodiment 1 of the present disclosure.

The drift layer 20 made of n-type silicon carbide is epitaxially grown on the semiconductor substrate 10 having 4H polytype and made of an n-type low-resistive silicon carbide with a first main surface having a plane direction being a (0001) plane with an off angle by a chemical vapor deposition (CVD) method to have a thickness of 5 μm to 80 μm at an impurity concentration of $10 \times 10^{15}$ to $1 \times 10^{17}$ cm$^{-3}$. The thickness of the drift layer 20 may be equal to or larger than 80 μm depending on withstand voltage of the silicon carbide semiconductor device.

Subsequently, an implantation mask is formed by photo-resist, for example, in a predetermined region in a surface of the drift layer 20, and aluminum (Al) as p-type impurity is ion-implanted. At this time, a depth of the ion implantation of Al is approximately equal to or larger than 0.5 μm and equal to or smaller than 3 μm so as not to exceed the thickness of the drift layer 20. An impurity concentration of ion-implanted Al is set within a range from $1 \times 10^{17}$ cm to $1 \times 10^{19}$ cm$^{-3}$ to be higher than that of the drift layer 20. Then, the implantation mask is removed. The region where Al is ion-implanted by the present process serves as the well region 30.

Subsequently, an implantation mask is formed by photoresist, for example, so that a predetermined position inside the well region 30 in the surface of the drift layer 20 is opened, and nitrogen (N) as n-type impurity is ion-implanted. An ion-implantation depth of N is shallower than the thickness of the well region 30. The impurity concentration of the ion-implanted N is set within a range from $1\times10^{18}$ cm$^{-3}$ to $1\times10^{21}$ cm$^{-3}$ to be higher than a p-type impurity concentration of the well region 30. A region showing the n type in the region where N is implanted in the present process serves as the source region 40. Then, the implantation mask is removed.

Al is ion-implanted into a predetermined region inside the well region 30 at a higher impurity concentration than that of the well region 30 by the similar method to form the contact region 35. It is sufficient that the impurity concentration of Al in the contact region 35 is within a range from $1\times10^{18}$ cm$^{-3}$ to $1\times10^{20}$ cm$^{-3}$.

Furthermore, N is ion-implanted into the surface layer part of the well region 30 between the contact region 35 and the first separation region 21 by the similar method to form the current diffusion region 41. An ion-implantation depth of N is equal to or larger 10 nm and equal to or smaller than 200 nm, for example, which is shallower than the thickness of the well region 30. It is sufficient that the impurity concentration of the current diffusion region 41 is within a range from $1\times10^{16}$ cm$^{-3}$ to $1\times10^{19}$ cm$^{-3}$.

Next, annealing is performed by a thermal treatment device in inactive gas atmosphere such as argon (Ar) gas atmosphere at a temperature of 1300 to 1900° C. for thirty seconds to one hour. The ion-implanted N and Al are electrical activated by the annealing.

Subsequently, a surface of a silicon carbide layer of each of the drift layer 20, the well region 30, the source region 40, the current diffusion region 41, and the contact region 35 are thermally oxidized to form a silicon oxide film as the gate insulating film 50 having a thickness equal to or larger than 10 nm and equal to or smaller than 300 nm. Subsequently, a polycrystal silicon film having conductivity is formed on the gate insulating film 50 by a decompression CVD method, and is patterned to form the gate electrode 60. Subsequently, the interlayer insulating film 55 made of silicon oxide is formed by a decompression CVD method.

The back surface ohmic electrode 72 is formed on the surface of the semiconductor substrate 10 where the drift layer 20 is not formed.

Next, a contact hole (first part of the contact hole) passing through the interlayer insulating film 55 and the gate insulating film 50 to reach the contact region 35 and the source region 40 in the active region is formed by a dry etching method. The contact hole is formed by the dry etching method, thus the contact hole perpendicular to the surface of the silicon carbide layer can be formed, thus a repetition cycle (cell pitch) of the unit cell can be reduced, and an on current density per unit area can be increased.

Subsequently, after a metal film containing nickel (Ni) as a main component is formed by a sputtering method, for example, a thermal treatment is performed at a temperature of 600° C. to 1000° C., and the metal film containing Ni as the main component and a silicon carbide layer in the contact hole (first part) are reacted to form silicide between the silicon carbide layer and the metal film. When the metal film is Ni, silicide is nickel silicide. Subsequently, a remaining metal film other than silicide made by reaction is removed by wet etching. Silicide formed at this time serves as the ohmic electrode 70.

Next, a resist mask is formed on the surface of each of the ohmic electrode 70 and the interlayer insulating film 55 by a photolithography method.

Subsequently, wet etching is performed on the gate insulating film 50 and the interlayer insulating film 55 on an upper side of a region including a surface of the first separation region 21 and a surface of the current diffusion region 41 using an etching solution containing hydrofluoric acid while the resist mask 90 is formed. The region on which the wet etching is performed at this time also serves as a part of the contact hole (second part of the contact hole). Then, the resist mask is removed.

Formed next is the Schottky electrode 71 of Ti or Mo, for example, Schottky-connected to the first separation region 21 is formed on the surface of the first separation region 21 and the surface of the current diffusion region 41. The source electrode 80 containing Al as a main component is formed on the Schottky electrode 71 and the ohmic electrode 70.

Subsequently, the back surface ohmic electrode 72 is formed on the side of the back surface, and the drain electrode 81 is formed on a bottom side to have contact with the back surface ohmic electrode 72, thus the SiC-MOSFET with the built-in SBD as the silicon carbide semiconductor device according to the present embodiment in a cross-sectional view illustrated in FIG. 1 can be manufactured.

Herein, an n-type impurity concentration of the current diffusion region 41 is set to be higher than that of the drift layer 20, particularly the first separation region 21. The n-type impurity concentration of the current diffusion region 41 is lower than that of the source region 40.

The n-type impurity concentration of the current diffusion region 41 is set to be lower than the p-type impurity concentration of the well region 30. According to this configuration, a depletion layer extending from a pn junction surface between the current diffusion region 41 and the well region 30 toward a side of the current diffusion region 41 can reach the Schottky electrode 71 formed on the current diffusion region 41 in an off state, thus electrical field on the Schottky electrode 71 can be reduced.

The drift layer 20 of the SiC-MOSFET with the built-in SBD according to the present embodiment needs not have a uniform impurity concentration in a whole region, however, the n-type impurity concentration in a range from the surface of the silicon carbide layer to a proximity to a position of a bottom of the well region 30 in a cross-sectional view illustrated in FIG. 4 may be higher than that of the drift layer 20 located closer to the side of the semiconductor substrate 10 in relation to the well region 30. According to such a configuration, the first separation region 21 and the second separation region 22 can have the higher n-type impurity concentration than the drift layer 20 on a lower side of the well region 30, thus resistance on the on state can be further reduced.

The source electrode 40 and the contact region 35 may be separately formed. When the source region 40 and the contact region 35 are formed to have contact with each other, a size of a unit cell can be reduced, thus on current flowing per unit area can be further increased, and resistance can be further reduced.

Furthermore, it is also applicable that the Schottky electrode 71 and the source electrode 80 are made up of the same material, or the source electrode 80 is made up of a plurality of materials stacked on each other.

According to the silicon carbide semiconductor device in the present embodiment, the region where the n-type current diffusion region 41 and the Schottky electrode 71 are adjacent to each other is provided adjacent to the SBD formed between the first separation region 21 and the Schottky electrode 71, thus the region where the unipolar current flows can be substantially extended in the cross-sectional lateral direction in the first separation region 21 as the region where the unipolar current flowing in the Schottky interface in a reflux operation state, the width of the first separation region 21 is increased, and the density of the unipolar current flowing in the reflux state can be increased without increasing the electrical field strength applied to the Schottky interface when the MOSFET is in the off state.

Thus, a size of a chip necessary to suppress an operation of a body diode formed between the well region 30 and the drift layer 20 can be reduced, and cost can be reduced compared with a silicon carbide semiconductor device in which the current diffusion region 41 is not formed.

Embodiment 2

FIG. 5 is a cross-sectional view of a part of an active region in a silicon carbide semiconductor device according to an embodiment 2. The silicon carbide semiconductor device according to the present embodiment is different from the silicon carbide semiconductor device according to the embodiment 1 in that an n-type channel current diffusion region 42 similar to the current diffusion region 41 is also formed in the surface layer part of the well region 30 between the second separation region 22 and the contact region 35. The other points are the same as those of the embodiment 1, thus the detailed description is omitted.

FIG. 5 is a cross-sectional view of a part of an SiC-MOSFET with a built-in SBD as the silicon carbide semiconductor device according to the present embodiment.

As illustrated in FIG. 5, in the SiC-MOSFET with the built-in SBD according to the present embodiment, the n-type channel current diffusion region 42 having a high n-type impurity concentration, which is similar to the current diffusion region 41, is formed in the surface layer part of the well region 30 between the second separation region 22 and the source region 40. The current diffusion region 41 and the channel current diffusion region 42 are formed to have the same thickness and the same impurity concentration.

The SiC-MOSFET with the built-in SBD according to the present embodiment can be manufactured by a manufacturing method similar to that of the SiC-MOSFET with the built-in SBD according to the embodiment 1. It is sufficient that the current diffusion region 41 and the channel current diffusion region 42 are formed by ion-implanting N using a resist mask used for forming the p-type well region 30.

At this time, N is ion-implanted also in surface parts of the source region 40 and the contact region 35, however, a density of the implanted ions is substantially one order of magnitude lower than the impurity concentration in the source region 40 and the contact region 35, thus the ions hardly have influence on the source region 40 and the contact region 35.

The current diffusion region 41 and the channel current diffusion region 42 are formed using the resist mask used for forming the well region 30, thus the other resist mask for forming the current diffusion region 41 needs not be formed, and the silicon carbide semiconductor device according to the present disclosure can be manufactured while suppressing increase in manufacturing cost.

According to the SiC-MOSFET with the built-in SBD in the present embodiment, the n-type channel current diffusion region 42 is formed in the surface layer of the channel region, thus the channel resistance can be further reduced.

Aluminum (Al) is used as the p-type impurity in the embodiments described above, however, the p-type impurity may be boron (B) or gallium (Ga). The n-type impurity may be phosphorus (P) instead of nitrogen (N). In the MOSFET described in the embodiments 1 to 2, the gate insulating film needs not necessarily be an oxide film such as $SiO_2$, however, an insulating film other than the oxide film or a combination of an insulating film other than the oxide film and an oxide film may also be applicable. In the description of the embodiments described above, a specific example is used in the crystal structure, the plane direction of the main surface, the off angle, and each implantation condition, for example, however, an application range is not limited to these numeral value ranges.

Furthermore, in the embodiments described above, the silicon carbide semiconductor device of a so-called vertical MOSFET includes the built-in SBD, however, the above configurations can also be applied to a MOSFET with a built-in SBD having a super junction structure.

Embodiment 3

The silicon carbide semiconductor device according to the embodiments 1 to 2 described above is applied to a power conversion device in the present embodiment. The present disclosure is not limited to a particular power conversion device, however, described hereinafter is a case of applying the present disclosure to a three-phase inverter as the embodiment 3.

FIG. 6 is a block diagram illustrating a configuration of a power conversion system to which a power conversion device according to the present embodiment is applied.

The power conversion system illustrated in FIG. 6 is made up of a power source 100, a power conversion device 200, and a load 300. The power source 100 is a direct current power source, and supplies direct current power to the power conversion device 200. The power source 100 can be made up of various components, thus can be made up of a direct current system, a solar battery, or a storage battery, for example, and may also be made up of a rectification circuit connected to an alternating current system or an AC/DC converter. The power source 100 may also be made up of a DC/DC converter converting a direct current power being output from a direct current system into predetermined power.

The power conversion device 200 is a three-phase inverter connected between the power source 100 and the load 300, converts direct current power supplied from the power source 100 into alternating current power, and supplies the alternating current power to the load 300. As illustrated in FIG. 6, the power conversion device 200 includes a main conversion circuit 201 converting direct current power into alternating current power and outputs the alternating current power, a drive circuit 202 outputting a drive signal for driving each switching element of the main conversion circuit 201, and a control circuit 203 outputting a control signal for controlling the drive circuit 202 to the drive circuit 202.

The drive circuit 202 performs off control on each normally-off type switching element by making the voltage of the gate electrode and the voltage of the source electrode have the same potential.

The load 300 is a three-phase electrical motor driven by the alternating current power supplied from the power conversion device 200. The load 300 is not for a specific purpose of usage, but is an electrical motor mounted on various types of electrical devices, and is used as an electrical motor for a hybrid automobile, an electrical automobile, a railroad vehicle, an elevator, or an air-conditioning apparatus, for example.

Details of the power conversion device 200 are described hereinafter. The main conversion circuit 201 includes a switching element and a reflux diode (not shown), and when the switching element is switched, the main conversion circuit 201 converts the direct current power supplied from the power source 100 into the alternating current power, and supplies the alternating current power to the load 300. There are various specific circuit configurations of the main conversion circuit 201. The main conversion circuit 201 according to the present embodiment is a three-phase full-bridge circuit with two levels, and can be made up of six switching elements and six reflux diodes antiparallel to the switching elements, respectively. The silicon carbide semiconductor device manufactured by the method of manufacturing the silicon carbide semiconductor device according to any one of the embodiments 1 to 3 described above is applied to each switching element of the main conversion circuit 201. The six switching elements are connected two by two in series to constitute upper and lower arms, and each pair of the upper and lower arms constitutes each phase (U phase, V phase, and W phase) of a full-bridge circuit. Output terminals of each pair of the upper and lower arms, that is to say, three output terminals of the main conversion circuit 201 are connected to the load 300.

The drive circuit 202 generates the drive signal for driving the switching element of the main conversion circuit 201, and supplies the drive signal to a control electrode of the switching element of the main conversion circuit 201. Specifically, the drive circuit 202 outputs a drive signal for making the switching element enter an on state and a drive signal for making the switching element enter an off state to a control electrode of each switching element in accordance with a control signal from the control circuit 203 describe hereinafter. When the switching element is kept in the on state, the drive signal is a voltage signal (on signal) equal to or larger than a threshold voltage of the switching element, and when the switching element is kept in the off state, the drive signal is a voltage signal (off signal) equal to or smaller than the threshold voltage of the switching element.

The control circuit 203 controls the switching element of the main conversion circuit 201 so that desired electrical power is supplied to the load 300. Specifically, the control circuit 203 calculates a time (on time) at which each switching element of the main conversion circuit 201 should enter the on state based on the electrical power to be supplied to the load 300. For example, the control circuit 203 can control the main conversion circuit 201 by PWM control modulating the on time of the switching element in accordance with the voltage to be output. Then, the control circuit 203 outputs to a control command (control signal) to the drive circuit 202 so that the on signal is output to the switching element which should enter the on state and the off signal is output to the switching element which should enter the off state at each point of time. The drive circuit 202 outputs the on signal or the off signal as the drive signal to the control electrode of each switching element in accordance with the control signal.

In the power conversion device according to the present embodiment, the silicon carbide semiconductor device according to the embodiments 1 to 2 is applied as the switching element of the main conversion circuit 201, thus a low loss power conversion device with increased reliability of high-speed switching can be achieved.

Described in the present embodiment is the example of applying the present disclosure to the three-phase inverter with two levels. However, the present disclosure is not limited thereto, but can be applied to various power conversion devices. The power conversion device with two levels is described in the present embodiment, however, a power conversion device with three levels or multiple levels is also applicable, and the present disclosure may be applied to a single-phase inverter when the electrical power is supplied to a single-phase load. When the electrical power is supplied to a direct current load, for example, the present disclosure can be applied to a DC/DC converter or an AC/DC converter.

The power conversion device to which the present disclosure is applied is not limited to the case where the load is the electrical motor described above, but can also be used as a power source device of an electrical discharge machine, a laser beam machine, an induction heat cooking machine, or a non-contact power supply system, and further can also be used as a power conditioner of a solar power system or an electricity storage system, for example.

EXPLANATION OF REFERENCE SIGNS 10 semiconductor substrate, 20 drift layer, 30 well region, 21 first separation region, 22 second separation region, 35 contact region, 40 source region, 41 current diffusion region, 42 channel current diffusion region, 50 gate insulating film, 55 interlayer insulating film, 60 gate electrode, 70 ohmic electrode, 71 Schottky electrode, 80 source electrode, 81 drain electrode, 100 power source, 200 power conversion device, 201 main conversion circuit, 202 drive circuit, 203 control circuit, 300 load.

The invention claimed is:

1. A silicon carbide semiconductor device, comprising:
a drift layer of a first conductivity type of a silicon carbide semiconductor formed on a first main surface of a semiconductor substrate of the first conductivity type;
well regions of a second conductivity type formed separately in a cross-sectional lateral direction in a surface layer of the drift layer and including a first separation region of the first conductivity type therebetween;
a second separation region of the first conductivity type formed in a region where the first separation region is not formed between the well regions;
a source region of the first conductivity type formed in an inner part of a surface layer of a semiconductor in a cross-sectional lateral direction in each of the well regions;
a contact region of the second conductivity type formed on a side closer to the first separation region in relation to the source region in the inner part of the surface layer of the semiconductor in the cross-sectional lateral direction in each of the well regions;
a current diffusion region of the first conductivity type formed in a surface layer part of each of the well regions between the contact region and the first separation region;
a gate insulating film formed on the second separation region and each of the well regions adjacent to the second separation region;
a gate electrode formed on the gate insulating film;

an ohmic electrode formed on the contact region;

a Schottky electrode formed on the first separation region to be Schottky-connected to the first separation region;

a source electrode formed on the ohmic electrode and the Schottky electrode; and a drain electrode formed on a second main surface of the semiconductor substrate located on a side opposite to the first main surface.

2. The silicon carbide semiconductor device according to claim 1, further comprising a channel current diffusion region of the first conductivity type in the surface layer part of each of the well regions between the source region and the second separation region.

3. The silicon carbide semiconductor device according to claim 1, wherein a first conductivity type impurity concentration of the current diffusion region is higher than a first conductivity type impurity concentration of the first separation region.

4. The silicon carbide semiconductor device according to claim 1, wherein a first conductivity type impurity concentration of the current diffusion region is lower than a first conductivity type impurity concentration of the source region.

5. The silicon carbide semiconductor device according to claim 1, wherein a first conductivity type impurity concentration of the current diffusion region is lower than a second conductivity type impurity concentration of each of the well regions.

6. The silicon carbide semiconductor device according to claim 1, wherein the current diffusion region has contact with the contact region.

7. The silicon carbide semiconductor device according to claim 1, wherein the first conductivity type impurity concentration of the current diffusion region is $1\times10^{16}$ cm$^{-3}$ or higher and $1\times10^{19}$ cm$^{-3}$ or lower.

8. The silicon carbide semiconductor device according to claim 1, wherein a thickness of the current diffusion region is equal to or larger than 10 nm and equal to or smaller than 200 nm.

9. A power conversion device, comprising:

a main conversion circuit including the silicon carbide semiconductor device according to claim 1 and configured to convert and output electrical power which has been input;

a drive circuit configured to make a voltage of the gate electrode of the silicon carbide semiconductor device coincide with a voltage of the source electrode, thereby making the silicon carbide semiconductor device perform an off operation, and output a drive signal for driving the silicon carbide semiconductor device to the silicon carbide semiconductor device; and a control circuit configured to output a control signal for controlling the drive circuit to the drive circuit.

*  *  *  *  *